United States Patent [19]

Watanabe et al.

[11] 4,151,472
[45] Apr. 24, 1979

[54] SELECTIVE CALLING CIRCUIT EMPLOYING CONTROLLED POWER SUPPLY THEREFOR

[75] Inventors: Eiji Watanabe; Junichi Onozawa; Jouji Tanaka; Takazo Takahashi; Tsuneo Kitamura; Hiroshi Yamada; Hiroshi Noguchi; Yukio Ueno, all of Tokyo, Japan

[73] Assignee: Kokusai Electric Company, Ltd., Tokyo, Japan

[21] Appl. No.: 851,374

[22] Filed: Nov. 14, 1977

[30] Foreign Application Priority Data

Aug. 22, 1977 [JP] Japan .................................. 52-100280

[51] Int. Cl.² .......................... H03K 17/26; H03K 5/18
[52] U.S. Cl. ........................................ 328/75; 328/119; 328/167; 179/84 VF; 179/84 SS
[58] Field of Search ........................ 328/75, 167, 119; 179/84 VF, 84 SS

[56] References Cited

U.S. PATENT DOCUMENTS

| | | | |
|---|---|---|---|
| 3,539,932 | 11/1970 | Briggs | 328/119 X |
| 3,696,252 | 10/1972 | Chapman | 328/167 X |
| 3,760,289 | 9/1973 | Hurtig | 328/167 X |
| 3,838,348 | 9/1974 | Pezzutti | 328/167 |
| 4,039,958 | 8/1977 | Krueger | 328/119 |

Primary Examiner—John S. Heyman
Attorney, Agent, or Firm—Schwartz, Jeffery, Schwaab, Mack, Blumenthal & Koch

[57] ABSTRACT

In a selective calling circuit including a band-pass filter which may be constituted by an active filter, and a power source for energizing the filter, a control signal is generated which has a predetermined duration in accordance with the output of the band-pass filter at a point of time whereat the output of the band-pass filter reaches a predetermined level. In response to the control signal, there is established a state in which the center frequency of the band-pass filter can be changed, and the output of the power source is changed from a first level to a second level for a period of time substantially corresponding to the predetermined duration of the control signal. At the aforementioned first level, the band-pass filter may be energized, while at the second level, it may be deenergized.

2 Claims, 2 Drawing Figures

SELECTIVE CALLING CIRCUIT EMPLOYING CONTROLLED POWER SUPPLY THEREFOR

This invention relates to a selective calling circuit designed so that calling is effected by selecting a predetermined tone signal group from among a plurality of tone signal groups each comprising a plurality of tone signals arriving in succession in accordance with a predetermined code, and more particularly to reliable receipt and detection of tone signals arriving in rapid succession.

The circuit of this type has heretofore used a so-called active filter (frequency-switchable band-pass filter) having its center frequency changeable so as to sequentially pass therethrough tone signals arriving in succession in accordance with a predetermined code. However, in order that tone signals arriving in rapid succession may be reliably received and detected by the use of such an active filter, it is necessary to provide special facilities for that active filter so that the filter may respond to the rapid successive arrivals of such tone signals. As such special facilities, various propositions have heretofore been made but any of them has encountered various difficulties such as complicated and expensive construction or difficulties in designing and none of those propositions has been satisfactory.

It is therefore an object of the present invention to effectively overcome the above-noted problems by a simplified construction which may be easily designed and inexpensively manufactured and to provide a selective calling circuit which may reliably receive and detect tone signals arriving in rapid succession.

Other objects, features and advantages of the present invention will become apparent from the following description taken in conjunction with the accompanying drawings.

An embodiment of the present invention will hereinafter be described with reference to the accompanying drawings. For the convenience of illustration, the ensuing description will be made with respect to the case where five tone signals arrive in succession, that is, the case of the five tone signal system. Of course, this is only for the convenience of illustration and it will readily be appreciated by those skilled in the art from the following description that the present invention is equally applicable to the case where any plurality of tone signals arrive in succession.

Figure 1:
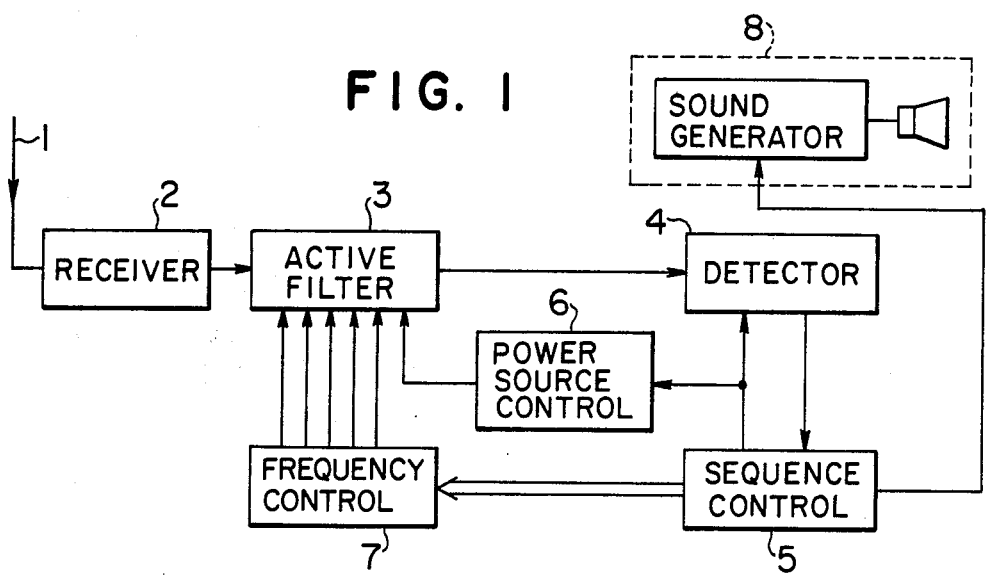
FIG. 1 is a block diagram showing the circuit according to an embodiment of the present invention.

FIG. 1 is a block diagram showing the selective calling circuit according to an embodiment of the present invention. In this figure, reference numberal 1 designates an antenna, 2 a receiver and 3 a band-pass filter adapted to pass therethrough a plurality of tone signals arriving in succession in accordance with a predetermined code, namely, a so-called active filter. Designated by 4 is a detector circuit adapted to detect when the output of the active filter 3 reaches a predetermined level and to generate a pulse signal. A sequence control circuit and a power source control circuit are designated by 5 and 6, respectively, and these circuits have close relations with what is the gist of the present invention, and will later be described in detail. Designated by 7 is a frequency control circuit operable to sequentially change the center frequency of the active filter 3 so as to enable that filter to sequentially pass therethrough the plurality of tone signals arriving in succession in accordance with the predetermined code as already noted. Denoted by 8 is an alarm generator.

Figure 2:
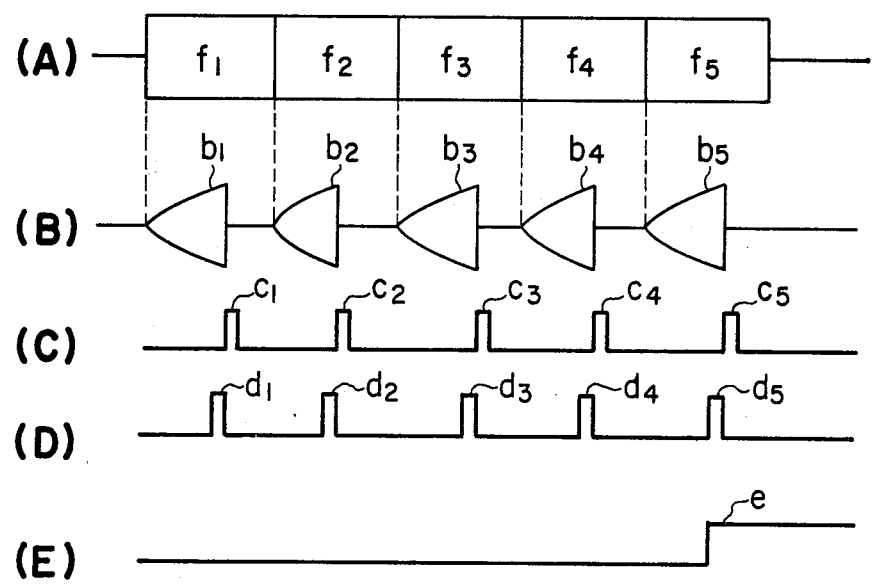
FIG. 2 is a waveform diagram useful for explaining the present invention.

Assuming that the signal code allotted to this selective calling circuit comprises tone signals of frequencies $f_1$-$f_2$-$f_3$-$f_4$-$f_5$ in this order, output signals respectively corresponding to the tone signals $f_1$-$f_2$-$f_3$-$f_4$-$f_5$ as shown in FIG. 2(A) appear in that order on the output side of the receiver 2. First, the output signal corresponding to the tone signal $f_1$ appears on the output side of the receiver 2. In this case, the power source for the active filter 3 is at a first level which energizes that filter, and the filter 3 is thus at its energized state. In such a state, when the output signal of the receiver 2 is applied to the filter 3, there appears on the output side of the filter 3 an output signal having a response waveform of a rising characteristic as indicated at $b_1$ in FIG. 2(B) and in this case, as already noted, the detector circuit 4 detects the arrival of the filter 3 output signal $b_1$ at its predetermined level at a point of time whereat such arrival has occurred, and generates a pulse signal as shown at $d_1$ in FIG. 2(D). Subsequently, the pulse signal $d_1$ from the detector circuit 4 is applied to the sequence control circuit 5, as a result of which one output of the circuit 5 is applied to the frequency control circuit 7, whereby this circuit 7 is enabled to establish a state in which the center frequency of the filter 3 can be changed so as to permit that filter 3 to pass the next tone signal $f_2$ therethrough. Simultaneously therewith, the sequence control circuit 5 generates another output which is a pulse signal having a predetermined duration as indicated at $c_1$ in FIG. 2(C). This pulse signal $c_1$ is applied to the detector circuit 4 to reset the same and is also applied to the power source control circuit 6. With the pulse signal $c_1$ so applied thereto, the power source control circuit 6 acts to hold the output of the power source for the filter 3 at a level whereat the filter 3 remains deenergized for a period of time substantially corresponding to the duration of the pulse signal $c_1$. Thus, the filter 3 is deenergized between a point of time immediately after the point of time whereat the output of the filter 3 has reached said predetermined level and a point of time sufficiently earlier than the point of time whereat the next tone signal arrives. When the filter 3 is so deenergized, the energy in that filter 3 abruptly disappears as seen from the waveform of FIG. 2(B) and once the duration of the pulse signal $c_1$ has elapsed, the power source control circuit 6 changes the output of the power source for the filter 3 to a level for energizing this filter, so that the filter 3 becomes ready to pass therethrough the next oncoming tone signal $f_2$. Thus, upon successive arrivals of the subsequent tone signals $f_2$, $f_3$, $f_4$ and $f_5$, the detector circuit 4 generates the pulse signals $d_2$, $d_3$, $d_4$ and $d_5$ in the same manner as already described with respect to the tone signal $f_1$, and the sequence control circuit 5 in turn generates pulse signals $c_2$, $c_3$, $c_4$ and $c_5$ corresponding to those pulse signals, whereby the filter 3 has its center frequency changed so as to pass $f_3$, $f_4$ and $f_5$ therethrough and the sequence control circuit 5 is caused by the pulse signal $d_5$ from the detector circuit 4 to generate a signal e as indicated in FIG. 2(E), such signal e being applied to the alarm generator 8 which thus generates an alarm.

According to the present invention, as will be appreciated from the foregoing description, the filter 3 is deenergized for a predetermined period of time immediately after the point of time whereat the output signal of that filter 3 has reached its predetermined level and after the lapse of such period, the filter 3 is automatically energized, thus enabling the tone signals arriving in rapid succession to be reliably received and detected. Moreover, this may be accomplished without changing the constants of the filter 3 itself but by adopting a construction in which the output of the power source for the filter 3 is changeable from one level to the other, and this leads to great ease of designing and simplification of the entire construction as well as lower cost of manufacture.

While the present invention has been shown and described with respect to a specific embodiment thereof, it should be understood that the present invention is not restricted to such an embodiment but includes all changes and modifications which will fall within the spirit and scope of the present invention as defined in the appended claims.

What is claimed is:

1. A selective calling circuit including band-pass filter means having its center frequency changeable so as to sequentially pass therethrough a plurality of tone signals arriving in succession in accordance with a predetermined code and power source means for energizing said band-pass filter means, the improvement comprising means for generating a control signal having a predetermined duration in accordance with the output of said band-pass filter means at a point of time whereat said output reaches a predetermined level, and means responsive to said control signal to establish a state in which the center frequency of said band-pass filter means can be changed and to change the output of said power source means from a first level whereat said band-pass filter means may be energized to a second level whereat said band-pass filter means may be deenergized, for a period of time substantially corresponding to said predetermined duration of said control signal.

2. A selective calling circuit according to claim 1, wherein said band-pass filter means comprises an active filter.